United States Patent
Dong et al.

(10) Patent No.: US 10,693,275 B2
(45) Date of Patent: Jun. 23, 2020

(54) DIRECTLY MODULATED LASER HAVING A VARIABLE LIGHT REFLECTOR

(71) Applicant: Nokia Solutions and Networks OY, Espoo (FI)

(72) Inventors: Po Dong, Morganville, NJ (US); Guilhem De Valicourt, Jersey city, NJ (US)

(73) Assignee: NOKIA SOLUTIONS AND NETWORKS OY, Espoo (FI)

( * ) Notice: Subject to any disclaimer, the term of this patent is extended or adjusted under 35 U.S.C. 154(b) by 0 days.

(21) Appl. No.: 15/671,231

(22) Filed: Aug. 8, 2017

(65) Prior Publication Data
US 2019/0052044 A1 Feb. 14, 2019

(51) Int. Cl.
| | |
|---|---|
| *H01S 5/14* | (2006.01) |
| *H01S 3/105* | (2006.01) |
| *H04B 10/50* | (2013.01) |
| *G02B 6/293* | (2006.01) |
| *H01S 5/0625* | (2006.01) |

(Continued)

(52) U.S. Cl.
CPC .......... *H01S 3/105* (2013.01); *G02B 6/29349* (2013.01); *H01S 5/06251* (2013.01); *H01S 5/06253* (2013.01); *H01S 5/14* (2013.01); *H04B 10/503* (2013.01); *H04B 10/504* (2013.01); *H01S 3/106* (2013.01); *H01S 3/1062* (2013.01); *H01S 5/06226* (2013.01); *H01S 5/141* (2013.01)

(58) Field of Classification Search
None
See application file for complete search history.

(56) References Cited

U.S. PATENT DOCUMENTS 5,844,926 A * 12/1998 Byron ................... H01S 3/0675
372/6
6,490,380 B2 12/2002 Atieh
(Continued)

FOREIGN PATENT DOCUMENTS

WO 2014021781 A1 2/2014

OTHER PUBLICATIONS

Dekun Liu, et al., "Rate Equation Analysis of High Speed Q-Modulated Semiconductor Laser," Journal of Lightwave Technology, vol. 28, No. 21, 2010, pp. 3128-3135.

*Primary Examiner* — Tod T Van Roy
(74) *Attorney, Agent, or Firm* — Mendelsohn Dunleavy, P.C.; Yuri Gruzdkov

(57) ABSTRACT

A directly modulated semiconductor laser whose optical output can be modulated by varying the transmittance of an end reflector of the laser cavity. In an example embodiment, the end reflector can be implemented using a lightwave circuit in which optical waveguides are arranged to form an optical interferometer. At least one of the optical waveguides may include a waveguide section configured to modulate the phase of an optical beam passing therethrough in response to an electrical radio-frequency drive signal in a manner that causes the transmittance and reflectance of the end reflector to be modulated accordingly. Advantageously, relatively high (e.g., >10 GHz) phase and/or amplitude modulation speeds of the optical output can be achieved in this manner to circumvent the inherent modulation-speed limitations of the laser's gain medium.

22 Claims, 5 Drawing Sheets

(51) Int. Cl.
*H01S 5/062* (2006.01)
*H01S 3/106* (2006.01)

(56) References Cited

U.S. PATENT DOCUMENTS

| | | | |
|---|---|---|---|
| 6,697,394 B2 * | 2/2004 | Tuennermann | H01S 3/105 372/12 |
| 8,068,736 B2 | 11/2011 | Kawashima et al. | |
| 8,155,534 B2 | 4/2012 | Winzer | |
| 9,059,559 B2 | 6/2015 | Zhang et al. | |
| 2003/0035446 A1 * | 2/2003 | Griffel | H01S 5/141 372/20 |
| 2005/0135733 A1 | 6/2005 | Reid et al. | |
| 2009/0257460 A1 * | 10/2009 | Mizutani | H01S 5/141 372/20 |
| 2012/0002694 A1 | 1/2012 | Bowers et al. | |
| 2014/0219301 A1 | 8/2014 | Chung | |
| 2015/0333475 A1 * | 11/2015 | Blumenthal | H04B 10/505 372/20 |

\* cited by examiner

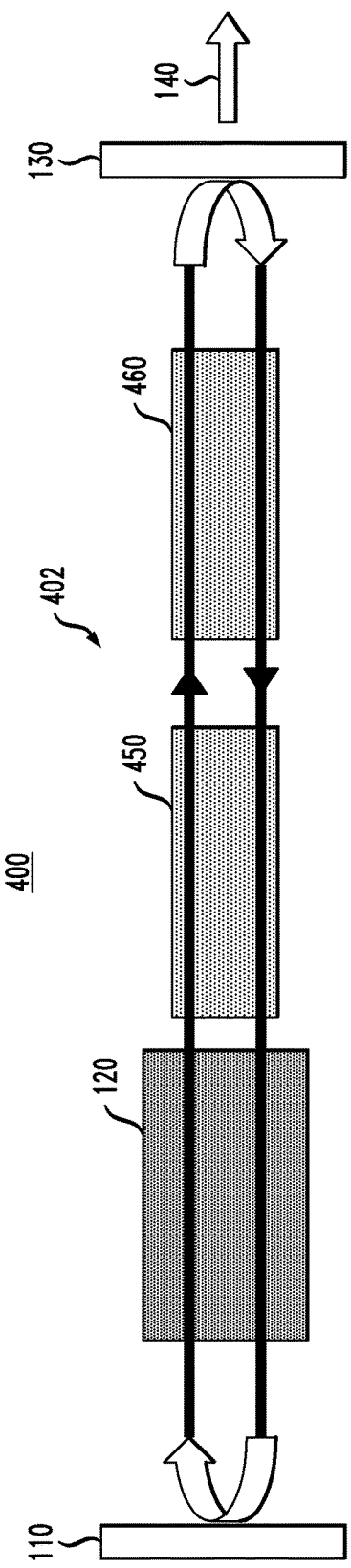
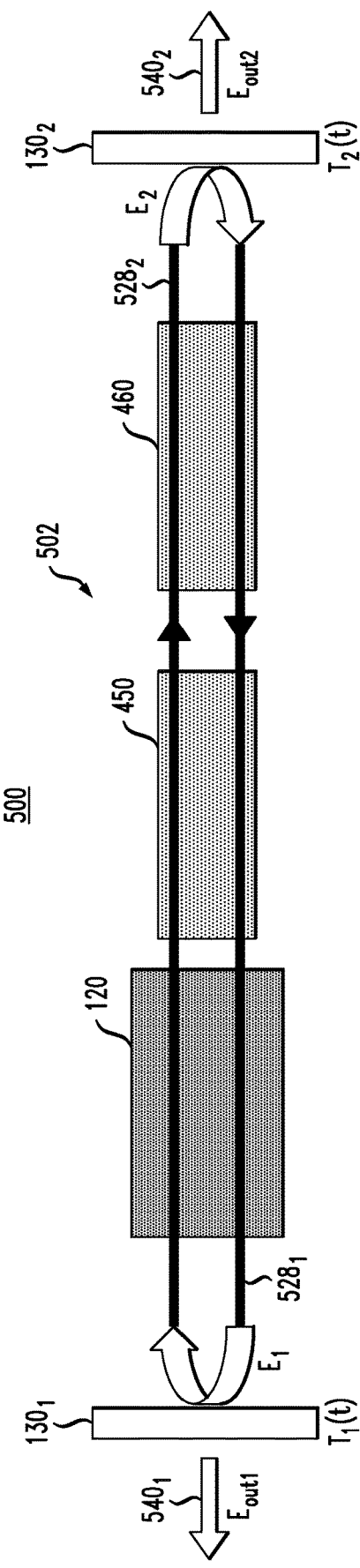

DIRECTLY MODULATED LASER HAVING A VARIABLE LIGHT REFLECTOR

BACKGROUND

Field

The present disclosure relates to light sources and, more specifically but not exclusively, to a directly modulated laser (DML) having a variable light reflector.

Description of the Related Art

This section introduces aspects that may help facilitate a better understanding of the disclosure. Accordingly, the statements of this section are to be read in this light and are not to be understood as admissions about what is in the prior art or what is not in the prior art.

Directly modulated lasers (DMLs) are used in telecom applications due to low power consumption and low cost. Typically, a DML is designed to generate a modulated optical signal in response to an electrical signal that modulates the laser's injection current. However, inherent properties of the laser's gain medium may significantly limit the upper frequency at which the optical output of a DML can be modulated in this manner. In addition, the changing injection current may impose a substantial electrical and/or thermal stress on the gain medium, which may cause detrimental frequency shifts (parasitic chirp) and transients (e.g., ringing) in operation, as well as a significant reduction in the operational lifetime of the laser.

SUMMARY OF SOME SPECIFIC EMBODIMENTS

At least some of the above-indicated problems in the state of the art are addressed by various embodiments of a directly modulated semiconductor laser whose optical output can be modulated by varying the transmittance of an end reflector of the laser cavity. In an example embodiment, the end reflector can be implemented using a lightwave circuit in which optical waveguides are arranged to form an optical interferometer. At least one of the optical waveguides may include a waveguide section configured to modulate the phase of an optical beam passing therethrough in response to an electrical radio-frequency drive signal in a manner that causes the transmittance and reflectance of the end reflector to be modulated accordingly. Advantageously, relatively high (e.g., >10 GHz) phase and/or amplitude modulation speeds of the optical output can be achieved in this manner to circumvent the inherent modulation-speed limitations of the laser's gain medium.

According to an example embodiment, provided is an apparatus comprising: a laser cavity including a first optical waveguide connected between a first light reflector and a second light reflector, the first optical waveguide including an active section configured to generate light in response to an electrical current being driven therethrough; and wherein the first light reflector comprises a first Michelson interferometer configured to transmit a first portion of the light out of the laser cavity and capable of controllably modulating the first portion in response to a first electrical radio-frequency (RF) signal applied to a first waveguide section thereof.

BRIEF DESCRIPTION OF THE DRAWINGS

Other aspects, features, and benefits of various disclosed embodiments will become more fully apparent, by way of example, from the following detailed description and the accompanying drawings, in which:

FIG. 4 shows a schematic diagram of a semiconductor laser according to an alternative embodiment;

FIG. 5 shows a schematic diagram of a semiconductor laser according to another alternative embodiment.

DETAILED DESCRIPTION

Figure 1:
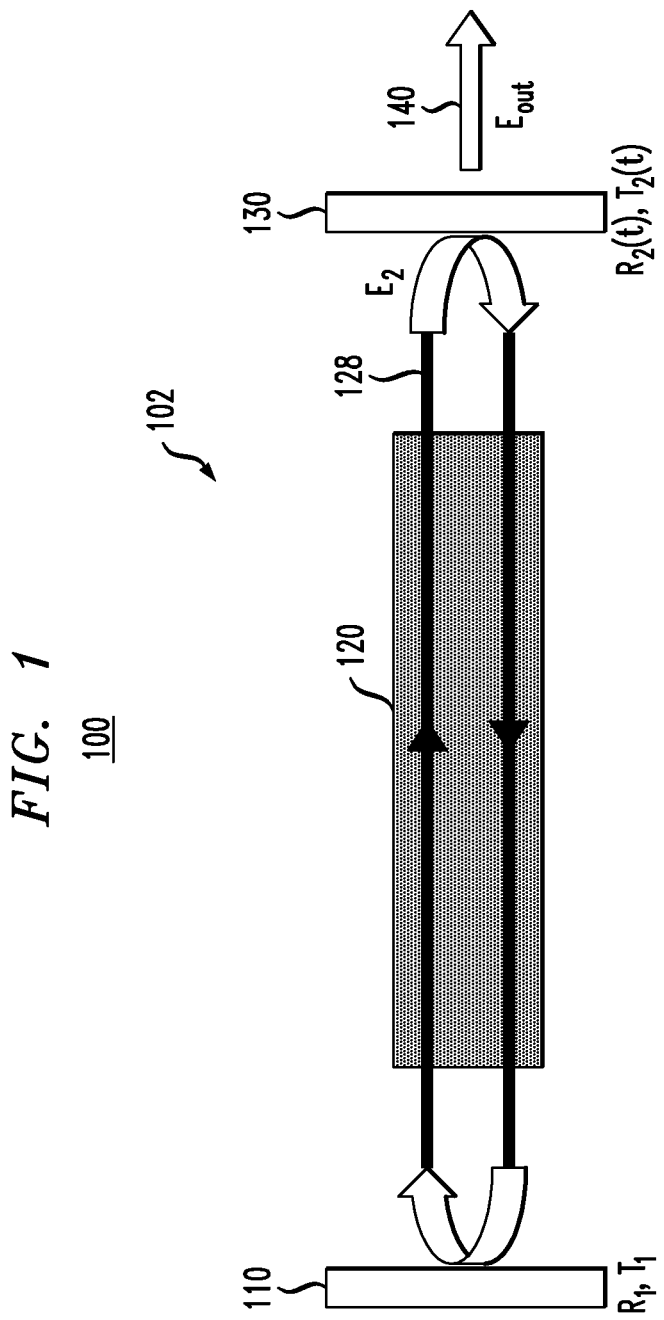
FIG. 1 shows a schematic diagram of a semiconductor laser according to an embodiment.

FIG. 1 shows a schematic diagram of a semiconductor laser 100 according to an embodiment. Laser 100 comprises a laser cavity 102 that includes an active section 120 and is bounded by light reflectors 110 and 130. Active section 120 may include an optical gain medium comprising any suitable set of semiconductor materials, e.g., selected from GaAs, InP, AlGaAs, InGaAsP, AlGaInP, and/or other suitable materials known in the pertinent art. The semiconductor materials used in active section 120 may be arranged to form a laser diode that can generate light in response to an electrical current being driven therethrough. In some embodiments of laser 100, heterostructure laser diodes and/or quantum-well laser diodes may be used.

Reflector 110 is a fixed light reflector whose reflectance $R_1$ and transmittance $T_1$ at the lasing wavelength $\lambda$ are respective constants that do not depend on time. In contrast, reflector 130 is a variable light reflector whose reflectance $R_2$ and transmittance $T_2$ at the lasing wavelength $\lambda$ can be controllably changed as a function of time t using an external electrical control signal (not explicitly shown in FIG. 1; see, e.g., FIGS. 2, 3, and 6). Example embodiments of reflector 130 are described in more detail below in reference to FIGS. 2 and 3.

In an example mode of operation, a characteristic frequency (e.g., modulation speed) with which the transmittance $T_2(t)$ and reflectance $R_2(t)$ of reflector 130 are changed over time can be significantly higher than the frequency corresponding to the relaxation oscillation time of the gain medium of active section 120. As a result, the semiconductor materials of active section 120 are in effect reacting to a time-averaged reflectance $<R_2(t)>$ of reflector 130, which can be made substantially constant over the operationally relevant time interval. Under these conditions, the electric field $E_2$ of an optical beam 128 that impinges on reflector 130 inside laser cavity 102 is not significantly perturbed by the changing transmittance $T_2(t)$ and reflectance $R_2(t)$ of reflector 130, whereas the electric field $E_{out}$ of an optical output beam 140 generated by laser 100 is modulated at a relatively high (e.g., radio) frequency in accordance with Eq. (1):

$$E_{out}=E_2 T_2(t) \qquad (1)$$

As an example, for a representative set of semiconductor materials that can be used in the gain medium of active section 120, the frequency corresponding to the relaxation oscillation time of the gain medium can be on the order of several MHz, whereas the transmittance $T_2(t)$ and reflectance $R_2(t)$ of reflector 130 can be modulated with a modulation speed that is higher than 1 GHz.

As used herein, the term "radio frequency" (often abbreviated as RF) refers to any of the frequencies that lie in the range from approximately 3 kHz to approximately 300 GHz, which include frequencies used for telecommunications. The term "radio frequency" is typically used to refer to electrical and/or electromagnetic oscillations.

Figure 2:
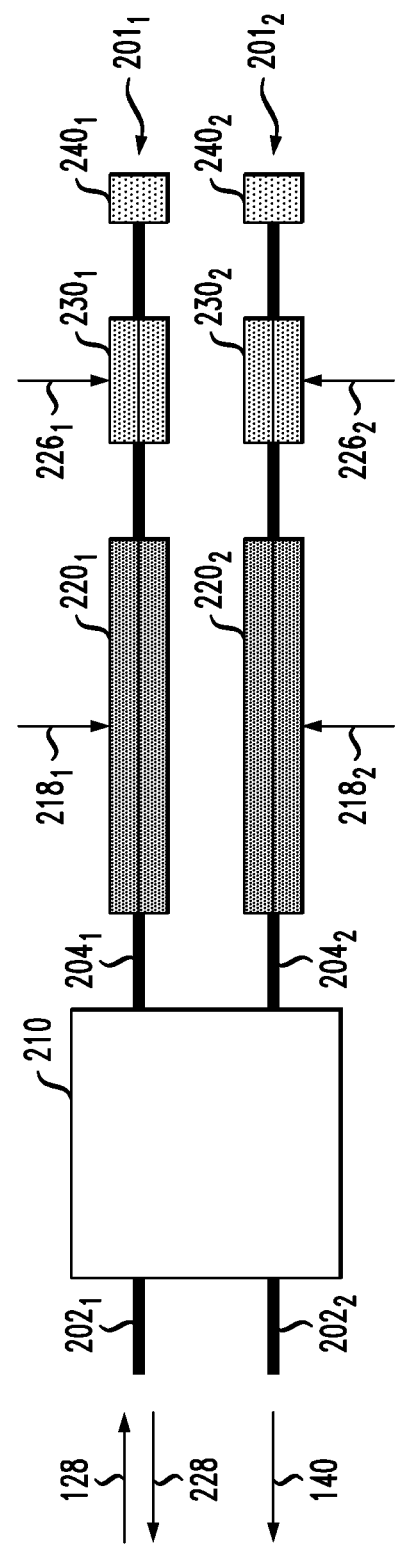
FIG. 2 shows a schematic circuit diagram of a variable reflector that can be used in the semiconductor laser of FIG. 1 according to an embodiment.

FIG. 2 shows a schematic circuit diagram of reflector 130 (FIG. 1) according to an embodiment. Optical beams 128 and 140 are also shown in FIG. 2 to better illustrate the relationship between the devices of FIGS. 1 and 2.

In this embodiment, reflector 130 comprises a Michelson interferometer implemented as a waveguide circuit. A first interferometer arm $201_1$ includes an optical waveguide $204_1$ end-connected to a fixed-reflectivity mirror $240_1$. Optical waveguide $204_1$ incorporates phase shifters $220_1$ and $230_1$. A second interferometer arm $201_2$ includes an optical waveguide $204_2$ end-connected to a fixed-reflectivity mirror $240_2$. Optical waveguide $204_2$ incorporates phase shifters $220_2$ and $230_2$. Interferometer arms $201_1$ and $201_2$ are optically coupled to optical waveguides $202_1$ and $202_2$ using a 2×2 optical (e.g., 3-dB) coupler 210. Optical waveguide $202_1$ connects reflector 130 to the inside of laser cavity 102 (FIG. 1). Optical waveguide $202_2$ is configured to operate as an optical output port of optical coupler 210 and laser cavity 102.

Optical waveguide $202_1$ operates to (i) receive optical beam 128 from the inside of optical cavity 102 (also see FIG. 1) and (ii) return a reflected optical beam 228 back to the optical cavity. The electric field $E_r$ of optical beam 228 can be expressed as follows:

$$E_r = E_2 R_2(t) \quad (2)$$

Optical waveguide $202_2$ operates to direct optical output beam 140 to external circuits and/or devices. The electric field $E_{out}$ of this optical output beam is expressed by Eq. (1).

In some embodiments, each of mirrors $240_1$ and $240_2$ can be implemented as a facet mirror or a distributed Bragg reflector (DBR).

Each of phase shifters $220_1$ and $220_2$ is a "fast" (e.g., electro-optic) phase shifter that is capable of changing, with a relatively high frequency (e.g., in the frequency range between 1 GHz and 100 GHz), the phase shift that it imparts on the corresponding optical beam propagating therethrough. In an example embodiment, phase shifters $220_1$ and $220_2$ are configured to receive RF drive signals $218_1$ and $218_2$, respectively, that are generated by the corresponding drive circuit (not explicitly shown in FIG. 2; see FIG. 6) using a data signal having a symbol rate from the RF range. In some embodiments, RF drive signals $218_1$ and $218_2$ can be generated using a data signal and a corresponding inverted data signal, respectively, to drive phase shifters $220_1$ and $220_2$ in a push-pull configuration. In an example embodiment, a push-pull configuration causes phase shifters $220_1$ and $220_2$ to impart phase shifts having the same absolute value but opposite signs. A person of ordinary skill in the art will understand that this push-pull configuration may be useful in that it can reduce (e.g., substantially eliminate) the chirp in optical output beam 140.

Each of phase shifters $230_1$ and $230_2$ is a "dc" phase shifter that is designed and configured to impart a desired constant phase shift on the corresponding optical beam propagating therethrough. In an example embodiment, phase shifters $220_1$ and $220_2$ are configured to receive dc bias voltages $226_1$ and $226_2$, respectively, selected such that the corresponding imparted constant phase shifts cause reflector 130 to exhibit a desired transfer function in response to RF drive signals $218_1$ and $218_2$. In operation, dc bias voltages $226_1$ and $226_2$ affect the time-averaged reflectance $\langle R_2(t) \rangle$ and the time-averaged transmittance $\langle T_2(t) \rangle$ of reflector 130 and, as such, can be selected to achieve desired ratios between the average optical power of optical beams 128, 228, and 140. RF drive signals $218_1$ and $218_2$ can then be used to cause the reflectance $R_2(t)$ and the transmittance $T_2(t)$ to oscillate around the respective time-averaged values thereof. As already indicated above, the oscillation of the transmittance $T_2(t)$ causes optical output beam 140 to be modulated. Depending on the selection of bias voltages $226_1$ and $226_2$ and the amplitudes and relative phases of RF drive signals $218_1$ and $218_2$, reflector 130 can be operated to cause optical output beam 140 to be: (i) only substantially intensity-modulated; (ii) only substantially phase-modulated; or (iii) both phase- and intensity-modulated. In different embodiments, the type of modulation can be selected, e.g., to cause optical output beam 140 to carry constellation symbols that encode the data to be transmitted in the corresponding communication system. Example constellations may be selected from the set including BPSK, QPSK, QAM, and PAM constellations.

In some embodiments, one of phase shifters $220_1$ and $220_2$ may be absent. In some embodiments, one or both of phase shifters $230_1$ and $230_2$ may be absent.

Figure 3:
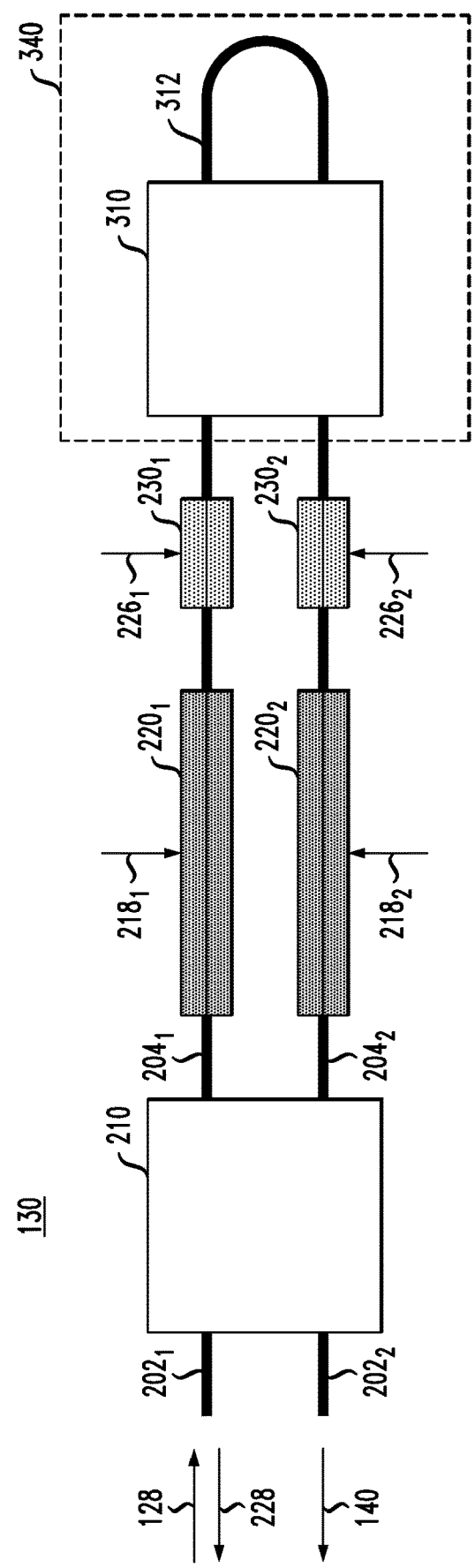
FIG. 3 shows a schematic circuit diagram of a variable reflector that can be used in the semiconductor laser of FIG. 1 according to an alternative embodiment.

FIG. 3 shows a schematic circuit diagram of reflector 130 (FIG. 1) according to an alternative embodiment. Optical beams 128 and 140 are also shown in FIG. 2 to better illustrate the relationship between the devices of FIGS. 1 and 2. Reflector 130 of FIG. 3 uses many of the same elements as reflector 130 of FIG. 2. These elements are labeled in FIG. 3 using the same labels as in FIG. 2.

One difference between reflector 130 of FIG. 3 and reflector 130 of FIG. 2 is that mirrors $240_1$ and $240_2$ of the latter are replaced by a loop mirror 340. In an example embodiment, loop mirror 340 comprises a 2×2 optical (e.g., 3-dB) coupler 310. A first pair of ports of optical coupler 310 are connected to optical waveguides $204_1$ and $204_2$, as indicated in FIG. 3. A second pair of ports of optical coupler 310 are connected to one another using an optical waveguide 312, as further indicated in FIG. 3.

Due to this modification, reflector 130 of FIG. 3 comprises a 2×2 Mach-Zehnder interferometer (MZI). A first pair of ports of this MZI are connected to optical waveguides $202_1$ and $202_2$, respectively. A second pair of ports of this MZI are connected to one another by optical waveguide 312. A first arm of the MZI includes optical waveguide $204_1$ and phase shifters $220_1$ and $230_1$. A second arm of the MZI includes optical waveguide $204_2$ and phase shifters $220_2$ and $230_2$. The first and second arms of the MZI are coupled to each other using optical couplers 210 and 310.

In alternative embodiments, other loop mirrors may similarly be used in place of loop mirror 340. Some embodiments may benefit from the use of loop mirrors disclosed, e.g., in U.S. Patent Application Publication No. 2005/0135733 and U.S. Pat. Nos. 6,490,380, 8,068,736, and 9,059,559, all of which are incorporated herein by reference in their entirety.

The use of a loop mirror (e.g., 340, FIG. 3) instead of a conventional facet or DBR mirror may enable fabrication of integrated or hybrid devices that combine the use of silicon-on-insulator (aII) and III/V-semiconductor platforms.

FIG. 4 shows a schematic diagram of a semiconductor laser 400 according to an alternative embodiment. Laser 400 is generally analogous to laser 100 and reuses many of the same elements. The description of these elements is not repeated here. Instead, the description given below mainly focuses on differences between lasers 400 and 100.

Laser 400 comprises a laser cavity 402 that, in addition to reflectors 110 and 130 and active section 120 (also see FIG. 1), includes a phaser 450 and an optical filter 460. Phaser 450 and optical filter 460 can be used, e.g., to enable a single-mode operation of laser 400. In an example embodiment, optical filter 460 can be a tunable band-pass filter having a relatively narrow passband configured to select a single lasing mode of optical cavity 402, by passing through the selected lasing mode and stopping the other lasing modes. Phaser 450 is a tunable phase shifter that can be used to spectrally align the selected lasing mode with a maximum of the passband of optical filter 460. The spectral alignment can typically be used to maximize the optical power of optical output beam 140 generated by laser 400.

FIG. 5 shows a schematic diagram of a semiconductor laser 500 according to another alternative embodiment. Laser 500 is generally analogous to laser 400 and reuses many of the same elements. The description of these elements is not repeated here. Instead, the description given below mainly focuses on differences between lasers 500 and 400.

One difference between lasers 500 and 400 is that fixed light reflector 110 of the latter is replaced by another instance (e.g., a nominal copy) of variable light reflector 130. The two instances of reflector 130 are labeled in FIG. 5 as 130$_1$ and 130$_2$. This modification enables laser 500 to generate and output two modulated optical beams instead of one, which modulated optical beams are labeled in FIG. 5 as 540$_1$ and 540$_2$, respectively.

In an example embodiment, optical beams 540$_1$ and 540$_2$ have the same carrier wavelength λ, which is the lasing wavelength of a laser cavity 502 of laser 500 selected using phaser 450 and an optical filter 460. The electric field $E_{out1}$ of optical output beam 540$_1$ and the electric field $E_{out2}$ of optical output beam 540$_2$ can be expressed as follows:

$$E_{out1}=E_1 T_1(t) \quad (3)$$

$$E_{out2}=E_2 T_2(t) \quad (4)$$

where $E_1$ is the electric field of an optical beam 528$_1$ that impinges on reflector 130$_1$ from the inside of laser cavity 502; $T_1(t)$ is the time-dependent transmittance of reflector 130$_1$; $E_2$ is the electric field of an optical beam 528$_2$ that impinges on reflector 130$_2$ from the inside of laser cavity 502; and $T_2(t)$ is the time-dependent transmittance of reflector 130$_2$. The time-dependent transmittances $T_1(t)$ and $T_2(t)$ can be different and/or independent functions of time, which advantageously enables optical beams 540$_1$ and 540$_2$ to carry different respective data streams.

Figure 6:
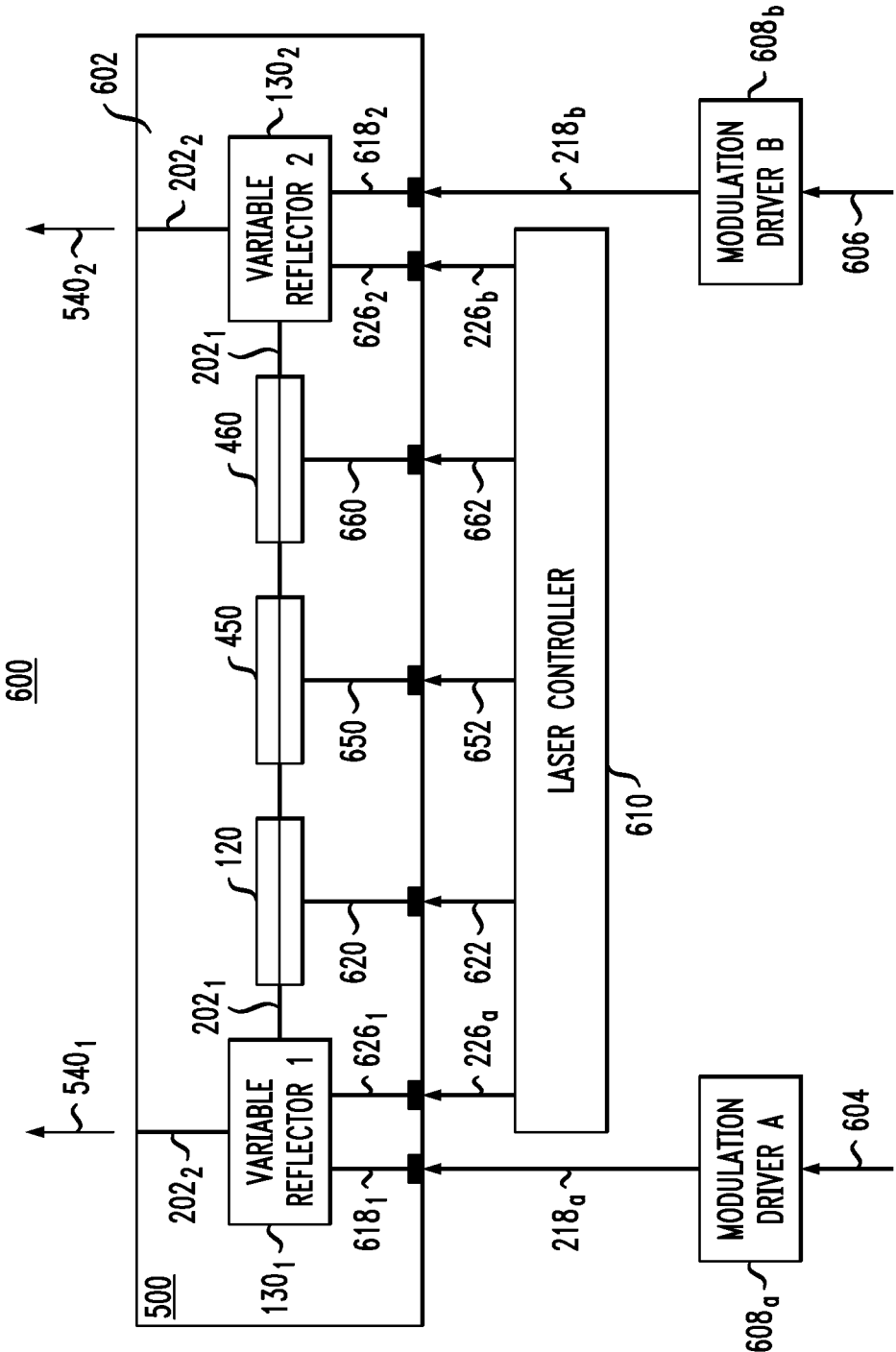
FIG. 6 shows a schematic diagram of an optical transmitter according to an embodiment.

FIG. 6 shows a schematic diagram of an optical transmitter 600 according to an example embodiment. Transmitter 600 comprises laser 500 (FIG. 5), a laser controller 610, and driver circuits 608$_a$ and 608$_b$. In the shown embodiment, laser 500 is implemented as an integrated planar lightwave circuit (PLC) disposed on a substrate 602. In some embodiments, each of driver circuits 608 may include a digital signal processor (DSP, not explicitly shown in FIG. 6) and one or more digital-to-analog converters (DACs, not explicitly shown in FIG. 6).

In operation, laser controller 610 generates various control signals that are needed to cause laser 500 to generate light at the selected lasing wavelength λ. In an example embodiment, laser controller 610 may generate the following dc or quasi-dc signals:

(i) a set of signals 226$_a$ that are applied to an electrical bus 626$_1$ of PLC 500. The set of signals 226$_a$ may include bias voltages 226$_1$ and 226$_2$ that are applied to phase shifters 230$_1$ and 230$_2$ of variable reflector 130$_1$ (also see FIGS. 2 and 3);

(ii) a set of signals 226$b$ that are applied to an electrical bus 626$_2$ of PLC 500. The set of signals 226$_b$ may include bias voltages 226$_1$ and 226$_2$ that are applied to phase shifters 230$_1$ and 230$_2$ of variable reflector 130$_2$ (also see FIGS. 2 and 3);

(iii) a set of signals 622 that are applied to an electrical bus 620 of PLC 500. The set of signals 622 may include one or more bias voltages and one or more injection currents that are applied to active section 120 of PLC 500;

(iv) a set of signals 652 that are applied to an electrical bus 650 of PLC 500. The set of signals 652 may include one or more bias voltages that are applied to phaser 450 of PLC 500; and (v) a set of signals 662 that are applied to an electrical bus 660 of PLC 500. The set of signals 662 may include one or more bias voltages that are applied to optical filter 460 of PLC 500 to tune the filter to the desired lasing wavelength λ.

Driver circuit 608$_a$ operates to generate a set of RF signals 218$_a$ in response to an input data stream 604. The set of RF signals 218$_a$ may include drive signals 218$_1$ and 218$_2$ that are applied to phase shifters 220$_1$ and 220$_2$ of variable reflector 130$_1$ of PLC 500 (also see FIGS. 2 and 3). In response to the set of RF signals 218$_a$, variable reflector 130$_1$ causes PLC 500 to generate modulated optical beam 540$_1$ that carries constellation symbols encoding the data of input data stream 604.

Driver circuit 608$_b$ similarly operates to generate a set of RF signals 218$_b$ in response to an input data stream 606. The set of RF signals 218$b$ may include drive signals 218$_1$ and 218$_2$ that are applied to phase shifters 220$_1$ and 220$_2$ of variable reflector 130$_2$ of PLC 500 (also see FIGS. 2 and 3). In response to the set of RF signals 218$_b$, variable reflector 130$_2$ causes PLC 500 to generate modulated optical beam 540$_2$ that carries constellation symbols encoding the data of input data stream 606.

In some embodiments, input data stream 606 can be different from and independent of input data stream 604.

In some embodiments, input data streams 604 and 606 can be received from respective different and independent data sources (not explicitly shown in FIG. 6).

Based on the provided description of transmitter 600, a person of ordinary skill in the art will understand how to make and use similar optical transmitters using lasers 100 and 400.

According to an example embodiment disclosed above in reference to FIGS. 1-6, provided is an apparatus (e.g., 600, FIG. 6) comprising: a laser cavity (e.g., 102, FIG. 1; 502, FIG. 5) including a first optical waveguide (e.g., 202$_1$, FIGS. 2, 3, 6) connected between a first light reflector (e.g., 130, FIG. 1) and a second light reflector (e.g., 110, FIG. 1), the first optical waveguide including an active section (e.g., 120, FIGS. 1, 4-6) configured to generate light in response to an electrical current (e.g., 622, FIG. 6) being driven therethrough; and wherein the first light reflector comprises a first Michelson interferometer (e.g., 130, FIG. 2) configured to transmit a first portion (e.g., 140, FIG. 2; 540$_1$, FIGS. 5-6) of the light out of the laser cavity and capable of controllably modulating the first portion (e.g., in accordance with Eq. (1), (3), or (4)) in response to a first electrical radio-frequency (RF) signal (e.g., 218$_1$, FIG. 2) applied to a first waveguide section (e.g., 220$_1$, FIG. 2) thereof.

In some embodiments of the above apparatus, the first Michelson interferometer is further configured to reflect a second portion (e.g., 228, FIG. 2) of the light back into the laser cavity.

In some embodiments of any of the above apparatus, the first Michelson interferometer is capable of controllably modulating a phase of the first portion of the light in response to the first electrical RF signal.

In some embodiments of any of the above apparatus, the first Michelson interferometer is capable of controllably modulating an amplitude of the first portion of the light in response to the first electrical RF signal.

In some embodiments of any of the above apparatus, the first Michelson interferometer is further capable of controllably modulating the amplitude of the first portion of the light in a chirp-free manner.

In some embodiments of any of the above apparatus, the second light reflector comprises a second optical interferometer (e.g., $130_2$, FIGS. 5, 6) configured to transmit a second portion (e.g., $540_2$, FIGS. 5-6) of the light out of the laser cavity and capable of controllably modulating the second portion (e.g., in accordance with Eq. (3) or (4)) in response to a second RF signal (e.g., $218_b$, FIG. 6) applied to a waveguide section (e.g., $220_1$, FIGS. 2, 3) thereof.

In some embodiments of any of the above apparatus, the second optical interferometer is a second Michelson interferometer (e.g., 130, FIG. 2).

In some embodiments of any of the above apparatus, the second optical interferometer is a Mach-Zehnder interferometer (e.g., 130, FIG. 3).

In some embodiments of any of the above apparatus, the second optical interferometer is capable of controllably modulating a phase of the second portion of the light in response to the second electrical RF signal.

In some embodiments of any of the above apparatus, the second optical interferometer is capable of controllably modulating an amplitude of the second portion of the light in response to the second electrical RF signal.

In some embodiments of any of the above apparatus, the first portion of the light has a carrier wavelength (e.g., wavelength λ); and wherein the second portion of the light has the carrier wavelength.

In some embodiments of any of the above apparatus, the apparatus further comprises: a first driver circuit (e.g., $608_a$, FIG. 6) configured to generate the first electrical RF signal in response to a first data stream (e.g., 604, FIG. 6); and a second driver circuit (e.g., $608_b$, FIG. 6) configured to generate the second electrical RF signal in response to a second data stream (e.g., 606, FIG. 6), the second data stream being different from the first data stream.

In some embodiments of any of the above apparatus, the first Michelson interferometer is further configured to reflect a third portion (e.g., 228, FIG. 2) of the light back into the laser cavity; and wherein the second optical interferometer is further configured to reflect a fourth portion (e.g., 228, FIG. 2) of the light back into the laser cavity.

In some embodiments of any of the above apparatus, the first Michelson interferometer comprises: a second optical waveguide (e.g., $204_1$, FIG. 2) optically coupled to the first optical waveguide, the second optical waveguide including the first waveguide section; a third optical waveguide (e.g., $204_2$, FIG. 2) optically coupled to the first optical waveguide; and an optical coupler (e.g., 210, FIG. 2) configured to optically interfere light beams received from the second and third optical waveguides to produce the first portion of the light at an output port (e.g., $202_2$, FIGS. 2, 3, 6) thereof.

In some embodiments of any of the above apparatus, the third optical waveguide includes a second waveguide section (e.g., $220_2$, FIG. 2) configured to modulate a phase of a light beam propagating therethrough in response to a second electrical RF signal (e.g., $218_2$, FIG. 2) applied thereto.

In some embodiments of any of the above apparatus, the first Michelson interferometer further comprises a first mirror (e.g., $240_1$, FIG. 2) and a second mirror (e.g., $240_2$, FIG. 2); wherein the second optical waveguide is end-connected between the optical coupler and the first mirror; and wherein the third optical waveguide is end-connected between the optical coupler and the second mirror.

In some embodiments of any of the above apparatus, the second optical waveguide includes a second waveguide section (e.g., $230_1$, FIG. 2) configured to apply a fixed phase shift to a light beam propagating therethrough in response to an electrical dc signal (e.g., $226_1$, FIG. 2) applied thereto.

In some embodiments of any of the above apparatus, the laser cavity includes an optical filter (e.g., 460, FIGS. 4, 5, 6) configured to select a single lasing mode of the laser cavity.

In some embodiments of any of the above apparatus, the optical filter is tunable (e.g., using 662, FIG. 6).

While this disclosure includes references to illustrative embodiments, this specification is not intended to be construed in a limiting sense. Various modifications of the described embodiments, as well as other embodiments within the scope of the disclosure, which are apparent to persons skilled in the art to which the disclosure pertains are deemed to lie within the principle and scope of the disclosure, e.g., as expressed in the following claims.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain the nature of this disclosure may be made by those skilled in the art without departing from the scope of the disclosure, e.g., as expressed in the following claims.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The described embodiments are to be considered in all respects as only illustrative and not restrictive. In particular, the scope of the disclosure is indicated by the appended claims rather than by the description and figures herein. All changes that come within the meaning and range of equivalency of the claims are to be embraced within their scope.

The description and drawings merely illustrate the principles of the disclosure. It will thus be appreciated that those of ordinary skill in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

The functions of the various elements shown in the figures, including any functional blocks labeled as "processors" and/or "controllers," may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

What is claimed is:

1. An apparatus comprising:
   a laser cavity including a first optical waveguide connected between a first light reflector and a second light reflector, the first optical waveguide including an active section configured to generate light in response to an electrical current being driven therethrough; and
   a first driver circuit for controlling the first light reflector to perform data modulation of an optical output beam;
   wherein the first light reflector comprises a first Michelson interferometer configured to transmit a first portion of the light out of the laser cavity and capable of controllably modulating the first portion to generate the optical output beam in response to a first electrical radio-frequency (RF) signal encoded with the data, the first electrical RF signal being generated by the first driver circuit; and
   wherein the first Michelson interferometer comprises:
   a second optical waveguide optically coupled to the first optical waveguide, the second optical waveguide including a first phase shifter configured to modulate a light beam propagating therethrough in response to the first electrical RF signal, the first phase shifter being an electro-optic phase shifter;
   a third optical waveguide optically coupled to the first optical waveguide; and
   an optical coupler configured to optically interfere light beams received from the second and third optical waveguides to produce the optical output beam at an output port thereof.

2. The apparatus of claim 1, wherein the first Michelson interferometer is further configured to reflect a second portion of the light back into the laser cavity.

3. The apparatus of claim 1, wherein the first Michelson interferometer is configured to modulate a phase of the first portion of the light in response to the first electrical RF signal.

4. The apparatus of claim 3, wherein the first Michelson interferometer is further configured to modulate an amplitude of the first portion of the light in response to the first electrical RF signal.

5. The apparatus of claim 1, wherein the first Michelson interferometer is configured to modulate an amplitude of the first portion of the light in response to the first electrical RF signal.

6. The apparatus of claim 5, wherein the first Michelson interferometer is further capable of controllably modulating the amplitude of the first portion of the light in a chirp-free manner.

7. The apparatus of claim 1, wherein the second light reflector comprises a second optical interferometer configured to transmit a second portion of the light out of the laser cavity and capable of controllably modulating the second portion in response to a second RF signal applied to a waveguide section thereof.

8. The apparatus of claim 7, wherein the second optical interferometer is a second Michelson interferometer.

9. The apparatus of claim 7, wherein the second optical interferometer is a Mach-Zehnder interferometer.

10. The apparatus of claim 7, wherein the second optical interferometer is capable of controllably modulating a phase of the second portion of the light in response to the second electrical RF signal.

11. The apparatus of claim 7, wherein the second optical interferometer is capable of controllably modulating an amplitude of the second portion of the light in response to the second electrical RF signal.

12. The apparatus of claim 7,
wherein the first portion of the light has a carrier wavelength; and
wherein the second portion of the light has the carrier wavelength.

13. The apparatus of claim 7, further comprising
a second driver circuit configured to generate the second electrical RF signal in response to a data stream.

14. The apparatus of claim 7,
wherein the first Michelson interferometer is further configured to reflect a third portion of the light back into the laser cavity; and
wherein the second optical interferometer is further configured to reflect a fourth portion of the light back into the laser cavity.

15. The apparatus of claim 1, wherein the third optical waveguide includes a second phase shifter configured to modulate a light beam propagating therethrough in response to a second electrical RF signal applied thereto, the second phase shifter being an electro-optic phase shifter.

16. The apparatus of claim 15,
wherein the first Michelson interferometer further comprises a first mirror and a second mirror;
wherein the second optical waveguide is end-connected between the optical coupler and the first mirror; and
wherein the third optical waveguide is end-connected between the optical coupler and the second mirror.

17. The apparatus of claim 15, wherein the second optical waveguide includes a third phase shifter configured to apply a fixed phase shift to a light beam propagating therethrough in response to an electrical dc signal applied thereto.

18. The apparatus of claim 17, wherein the third optical waveguide includes a fourth phase shifter configured to apply a respective fixed phase shift to a light beam propagating therethrough in response to a respective electrical dc signal applied thereto.

19. The apparatus of claim 18,
wherein the first Michelson interferometer further comprises a first mirror and a second mirror;
wherein the second optical waveguide is end-connected between the optical coupler and the first mirror; and
wherein the third optical waveguide is end-connected between the optical coupler and the second mirror.

20. The apparatus of claim 1, wherein the laser cavity includes an optical filter configured to select a single lasing mode of the laser cavity.

21. The apparatus of claim 20, wherein the optical filter is tunable.

22. The apparatus of claim 1, wherein the first electrical RF signal has a modulation speed higher than 1 GHz.

* * * * *